(12) United States Patent
Lee

(10) Patent No.: US 7,952,951 B2
(45) Date of Patent: May 31, 2011

(54) SMALL-SIZED FUSE BOX AND SEMICONDUCTOR INTEGRATED CIRCUIT HAVING THE SAME

(75) Inventor: Jong Jin Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 67 days.

(21) Appl. No.: 12/483,440

(22) Filed: Jun. 12, 2009

(65) Prior Publication Data

US 2010/0165774 A1     Jul. 1, 2010

(30) Foreign Application Priority Data

Dec. 26, 2008   (KR) .................. 10-2008-0134272

(51) Int. Cl.
  *G11C 17/16*   (2006.01)
(52) U.S. Cl. ....................... 365/225.7; 365/96
(58) Field of Classification Search .............. 365/96; 327/525
  See application file for complete search history.

(56) References Cited

U.S. PATENT DOCUMENTS

| | | | | |
|---|---|---|---|---|
| 5,253,208 A | * | 10/1993 | Kang | 365/200 |
| 5,430,679 A | * | 7/1995 | Hiltebeitel et al. | 365/200 |
| 5,570,318 A | * | 10/1996 | Ogawa | 365/200 |
| 6,682,959 B2 | | 1/2004 | Bang et al. | |
| 6,809,404 B2 | * | 10/2004 | Maki | 257/665 |
| 6,867,441 B1 | | 3/2005 | Yang et al. | |
| 6,900,516 B1 | | 5/2005 | Bänisch et al. | |
| 6,937,533 B2 | * | 8/2005 | Hojo et al. | 365/200 |
| 7,443,756 B2 | * | 10/2008 | Lee et al. | 365/225.7 |
| 2006/0226507 A1 | | 10/2006 | Lin et al. | |

FOREIGN PATENT DOCUMENTS

| | | |
|---|---|---|
| KR | 1019980054486 A | 9/1998 |
| KR | 1020040026994 A | 4/2004 |
| KR | 10-0546296 B1 | 1/2006 |

* cited by examiner

*Primary Examiner* — Tan T. Nguyen
(74) *Attorney, Agent, or Firm* — Ladas & Parry LLP

(57) ABSTRACT

Disclosed are a fuse box and a semiconductor integrated circuit having the same. The semiconductor integrated circuit includes a plurality of banks, column control blocks, and column fuse blocks. The plurality of banks including a plurality of mat rows and mat columns. The banks are arranged in row and column directions and disposed away from each other. The column control blocks are disposed in a space between the banks which are extended to the column direction. The column fuse blocks are disposed adjacent to the column control blocks and have a plurality of fuse boxes. The fuse boxes include fuse sets arranged in two rows. The fuse boxes are disposed to correspond to the one mat column. Each fuse box has an interconnection fuse and address fuses which are arranged with a constant interval and are the same type.

25 Claims, 6 Drawing Sheets

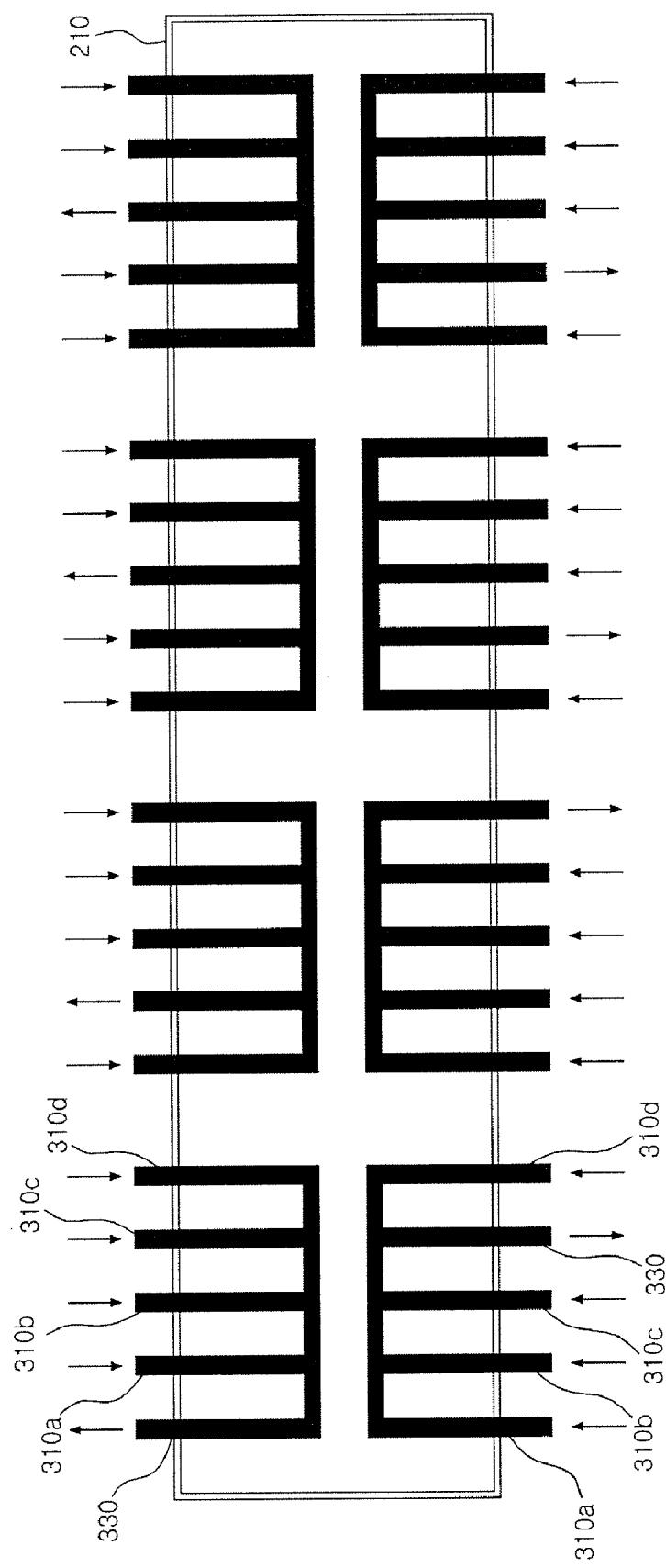

SMALL-SIZED FUSE BOX AND SEMICONDUCTOR INTEGRATED CIRCUIT HAVING THE SAME

CROSS-REFERENCES TO RELATED APPLICATION

The present application claims priority under 35 U.S.C. 119(a) to Korean application number 10-2008-0134272, filed on Dec. 26, 2008, in the Korean Patent Office, which is incorporated by reference in its entirety as if set forth in full.

BACKGROUND OF THE INVENTION

1. Technical Field

The present invention relates generally to fuse boxes and a semiconductor integrated circuit having the same and, more particularly, to a small-sized fuse box and a semiconductor integrated circuit having the same.

2. Related Art

As semiconductor integrated circuits become more and more reduced in size, the number of devices which are included into a given semiconductor chip increases. As the number of devices in semiconductor integrated circuits increase, then the frequency of defects increases simply because of the increased number of devices. This can adversely affect the yield of the semiconductor devices by making an unacceptable percentage of these semiconductor devices that are faulty.

In a conventional semiconductor integrated circuit, to reduce the density of the defects, a repair technique in which a defective cell is replaced with an additional ancillary cell has been proposed. This repair operation can be executed by displacing a redundancy circuit block in the semiconductor integrated circuit. The redundancy circuit block has to somehow recognize a defect position in the semiconductor integrated circuit and then to subsequently change an address path away from the defect cell to an additional ancillary cell. Here, the position of the address associated with the defective cell is stored in a fuse that is included in the redundancy circuit block.

The redundancy circuit block consists of a fuse block, which has a plurality of address fuses, and a plurality of redundancy circuits connected to the fuse blocks.

FIG. 1 is a plane view showing an example of a fuse box in a conventional column fuse block.

Referring to FIG. 1, address fuses 10, which are disposed away from each other, are arranged in a space defined by a fuse box 20. The address fuses 10 forms fuse sets, each of which has four fuses, and an individual redundancy circuit (not shown) is connected to the fuse set. The address fuses 10 that form one fuse set are connected to the dependency circuit (not shown) through one of the wires 30a, 30b, 30c and 30d.

The wires 30a, 30b, 30c and 30d are routed to the circumference of the fuse box 20 in consideration of the blowing of the address fuses 10. Furthermore, the wires 30a, 30b, 30c and 30d are separately disposed along both sides of the fuse box 20, so that these wires are disposed sufficiently apart from each other in order to prevent or minimize any electrical interference therebetween. In addition, each of the wires 30a, 30b, 30c and 30d has to maintain an appropriate line width needed to prevent a signal delay.

As the integration of the semiconductor devices progressively increases, it becomes more necessary to integrate more memory cells in a restricted area. Accordingly, along with the reduction of the memory cell area, the fuse box area is also required to be reduced.

However, as well-known to those skilled in the art, it is very difficult to reduce the area of the fuse box 20 because the pitch between the fuses must be guaranteed within a laser alignment tolerance in order not to be adversely influenced at the time of blowing an adjacent fuse.

Furthermore, as mentioned above, since the wires 30a, 30b, 30c and 30d, which connect the address fuses 10 to a redundancy circuit block (not shown), are routed to the circumference of the fuse boxes 20, the areas of the wires 30a, 30b, 30c and 30d must necessarily also be included in the substantive area of the fuse boxes 20. Therefore, as considering the whole area of the semiconductor device, the relative ratio of the fuse box may be increased in area. That is, the fact that it is required to reduce the area of the redundancy circuit block, especially, the fuse boxes and the peripheral circuit thereof in the semiconductor integrated circuit.

SUMMARY

A small-sized fuse box having a reduced area and a semiconductor integrated circuit having the same are described herein.

According to one aspect, a fuse box comprises a plurality fuse sets wherein the plurality of fuse sets are arranged in two rows.

According to another aspect, a semiconductor integrated circuit comprises a bank that have a plurality of mats which are arranged in row and column directions with a constant interval, and a column fuse block disposed at an edge of the bank, having a plurality of fuse boxes, wherein the fuse box has a plurality of fuse sets which are arranged in two rows and wherein the fuse box is disposed to correspond to the mats.

According further another aspect, a semiconductor integrated circuit comprises a plurality of banks including a plurality of mat rows and mat columns each of which has a plurality of mats. The banks are arranged in row and column directions and disposed away from each other. Column control blocks, each of which includes a column redundancy circuit, are disposed in a space between the banks which are extended to the column direction. Column fuse blocks, which are adjacent to the column control blocks, have a plurality of fuse boxes, in which the fuse boxes include a plurality of fuse sets which are arranged in two rows. The fuse boxes are disposed to correspond to the one mat column, and each of the fuse boxes has a interconnection fuse and address fuses, which are arranged with a constant interval, in a same type.

BRIEF DESCRIPTION OF THE DRAWINGS

It is understood herein that the drawings are not necessarily to scale and in some instances proportions may have been exaggerated in order to more clearly depict certain features of the invention. The above and other aspects, features and other advantages of the subject matter of the present disclosure will be more clearly understood from the following detailed description taken in conjunction with the accompanying drawings, in which:

FIG. 7 is a plane view showing signal input/output between address fuses and interconnection fuses.

DETAILED DESCRIPTION

Figure 1:
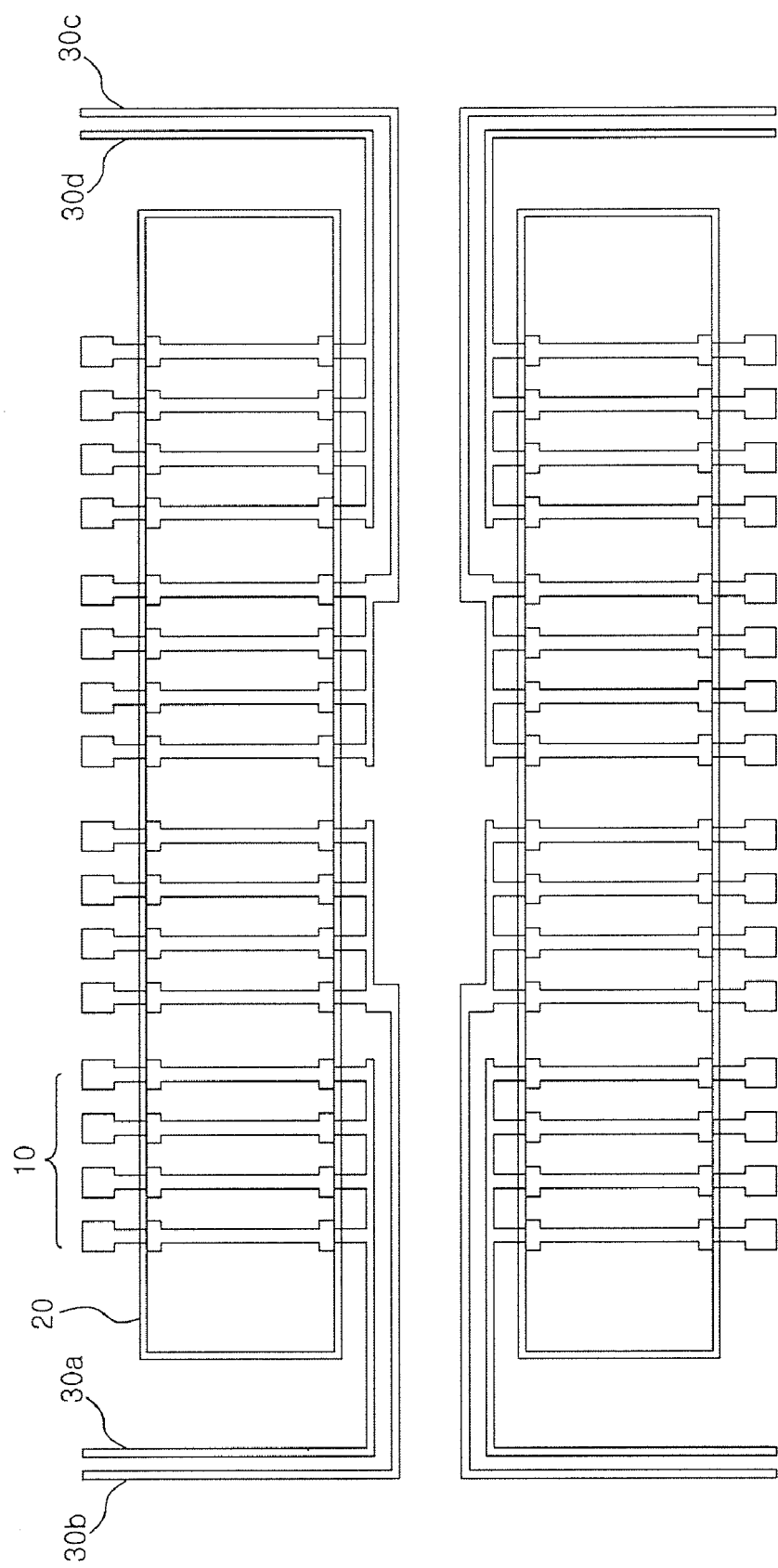
FIG. 1 is a plane view showing an example of a fuse box in a conventional column fuse block.
Figure 2:
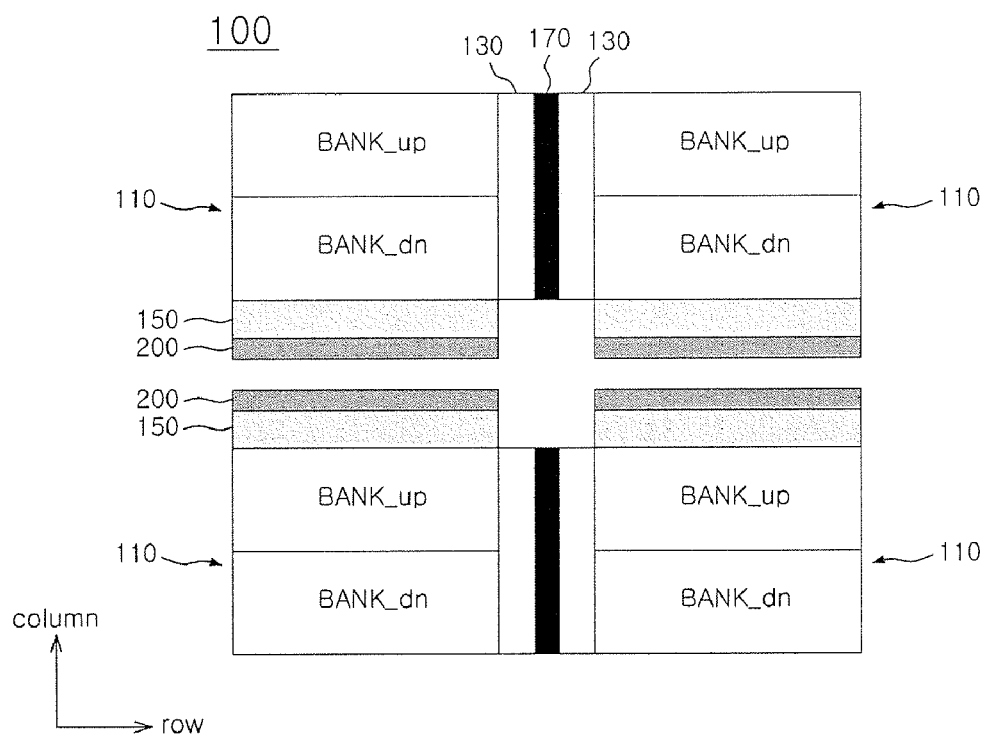
FIG. 2 is a schematic view illustrating an example of a structure of a semiconductor integrated circuit according to one embodiment.

Referring to FIG. 2, a semiconductor integrated circuit 100 can include a plurality of stack banks 110, row control blocks 130, column control blocks 150, row fuse blocks 170, and column fuse blocks 200.

Each of the stack banks 110 can include an up-bank BANK_up and a down-bank BANK_dn. The stack banks 110, which form the semiconductor integrated circuit 100, are disposed apart from each other in row and column directions. Here, the up-bank BANK_up and the down-bank BANK_dn can be a unit bank in which a wire is not disconnected to each other or can be separate banks which are classified into upper and lower parts.

The row control blocks 130 can be disposed between the stack banks 110, which are arranged in a row direction, and can be disposed opposite to the stack banks 110. For example, the row control blocks 130 can include a row decoder (not shown).

The row fuse blocks 170 are disposed between the row control blocks 130 and include row fuses (not shown) to replace a defective line in the stack banks 110 disposed at both sides thereof to an additional line.

The column control blocks 150 can be disposed in parallel between the stack banks 110, which are arranged in a column direction, and can be disposed opposite to the stack banks 110. The column control blocks 150 can include, for example, a column decoder (not shown) and a predecoder (not shown).

Each of the column fuse blocks 200 can be disposed opposite to each of the column control blocks 150. For example, the column fuse blocks 200 can be disposed between the stack banks 110, and the column fuse blocks 200 can be disposed adjacent to the column control blocks 150. Therefore, the column fuse blocks 200, which are arranged in a column direction, are disposed opposite to each other between the stack banks 110.

Figure 3:
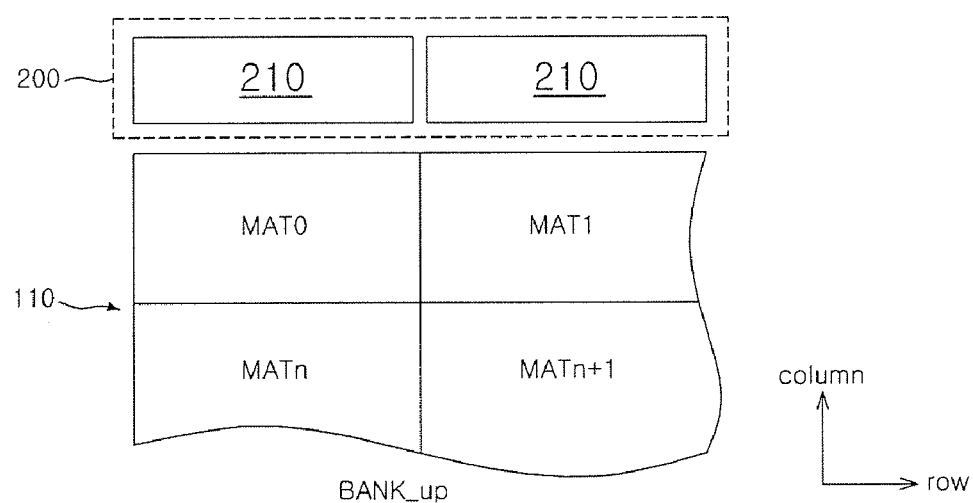
FIG. 3 is an enlarged plane view showing a stack bank and a column fuse block according to one embodiment.

FIG. 3 is an enlarged plane view showing the stack bank 110 and the column fuse block 200 according to one embodiment. For convenience in illustration, the column control block 150 is omitted from FIG. 3.

Referring to FIG. 3, the stack bank 110 can include the up-bank and the down-bank (not shown) and a plurality of mats that forms one of the up- and down-banks. The mats are arranged in a matrix type with a mat column and a mat row.

Meanwhile, the column fuse block 200 can include a plurality of fuse boxes 210. The plurality of the fuse boxes 210 can be arranged, for example, in a row direction with a constant interval. Furthermore, each of the fuse boxes 210 can be disposed to correspond to the one mat, especially to the mat row.

Figure 4:
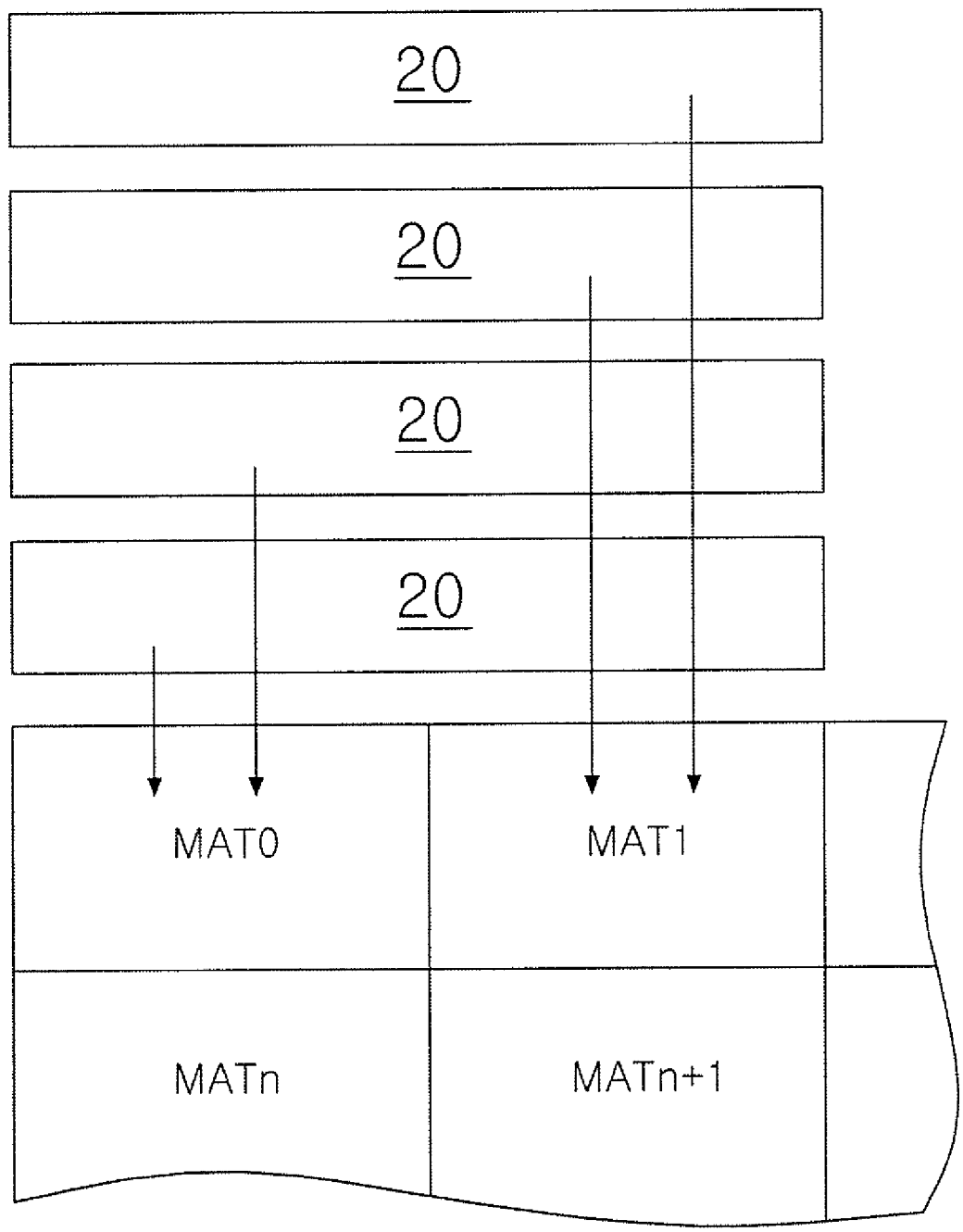
FIG. 4 is a schematic view illustrating the relationship between fuse boxes and mats in a conventional semiconductor integrated circuit.

Here, as shown in FIG. 4, conventional fuse boxes 20 are disposed to correspond to two adjacent mats in a row direction, for example, having four rows. At this time, the two fuse boxes 20 are related to a column repair of a first mat MAT0 and other two fuse boxes 20 are related to a column repair of a second mat MAT1.

On the other hand, in one embodiment, since one fuse box 210 correspond to one mat column, then this arrangement can reduce an area of the column fuse blocks 200, which will be illustrated in more detailed below.

Figure 5:
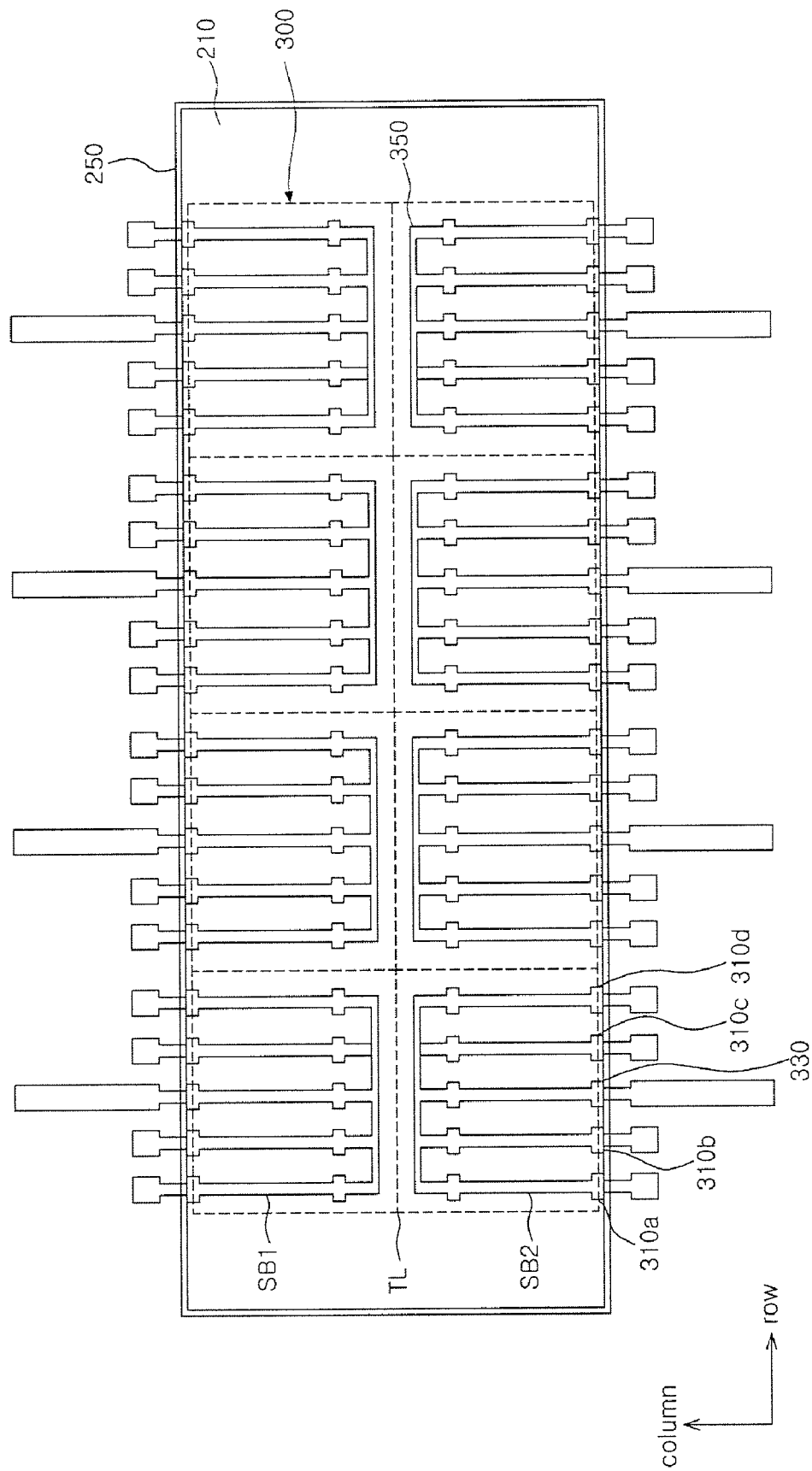
FIG. 5 is a plane view showing a fuse box according to one embodiment.

FIG. 5 is a plane view showing the fuse box 210 according to one embodiment.

Referring to FIG. 5, the fuse box 210 can include a plurality of fuse sets 300. First, the fuse box 210 can be defined by a guard ring 250. The guard ring 250 can be a moisture proof layer to prevent moisture from percolating towards the fuses. For example, this guard ring 250 can be made of a metal wire.

The number of fuse sets 300 can be included in the fuse box 210 as much as the number of the mats in the same column, i.e., as much as the number of the mats to form one mat column. In one embodiment, since the semiconductor memory device has banks, each of which is classified into eight blocks as exemplarily illustrated, then the eight fuse sets 300 can be included in the fuse box 210.

The fuse sets 300 according to one embodiment can be arranged in two rows the fuse box 210. In one embodiment, the fuse set 300 which is disposed in one row is referred to as a sub-block. Accordingly, for example, each of first and second sub-blocks SB1 and SB2 can consist of four fuse sets 300. The first and second sub-blocks SB1 and SB2 can be disposed symmetrically around their center line TL.

Each of the fuse sets 300 can include a plurality of address fuses 310a, 310b, 310c and 310d and an interconnection fuse 330. Four fuses can be provided per the fuse set 300 in consideration of the number of blocks in the bank. The interconnection fuse 330 is used as a connection wire that finally transfer information of the address fuses 310a, 310b, 310c and 310d to the column control block 170 through a column redundancy circuit block. One interconnection fuse can be provided per the fuse set 300. The address fuses 310a, 310b, 310c and 310d and the interconnection fuses 330 can be formed to have the same shape and space and the interconnection fuse 330 can be disposed along one side of the address fuses 310a, 310b, 310c and 310d or between the address fuses 310a, 310b, 310c and 310d. Furthermore, one end of each of the address fuses 310a, 310b, 310c and 310d can be electrically coupled to one end of the interconnection fuse 330 through a common wire 350 and the other end of the interconnection fuse 330 is extended toward the guard ring 250. Therefore, the common wires 350 of the first and second sub-blocks SB1 and SB2 are disposed at the center of the fuse box 210, and are disposed in a vicinity adjacent to the center line TL.

Furthermore, as shown in the plane view, the address fuses 310a, 310b, 310c and 310d, the interconnection fuses 330, and the common wire 350 can be made of the same material when applying a single patterning process.

Figure 6:
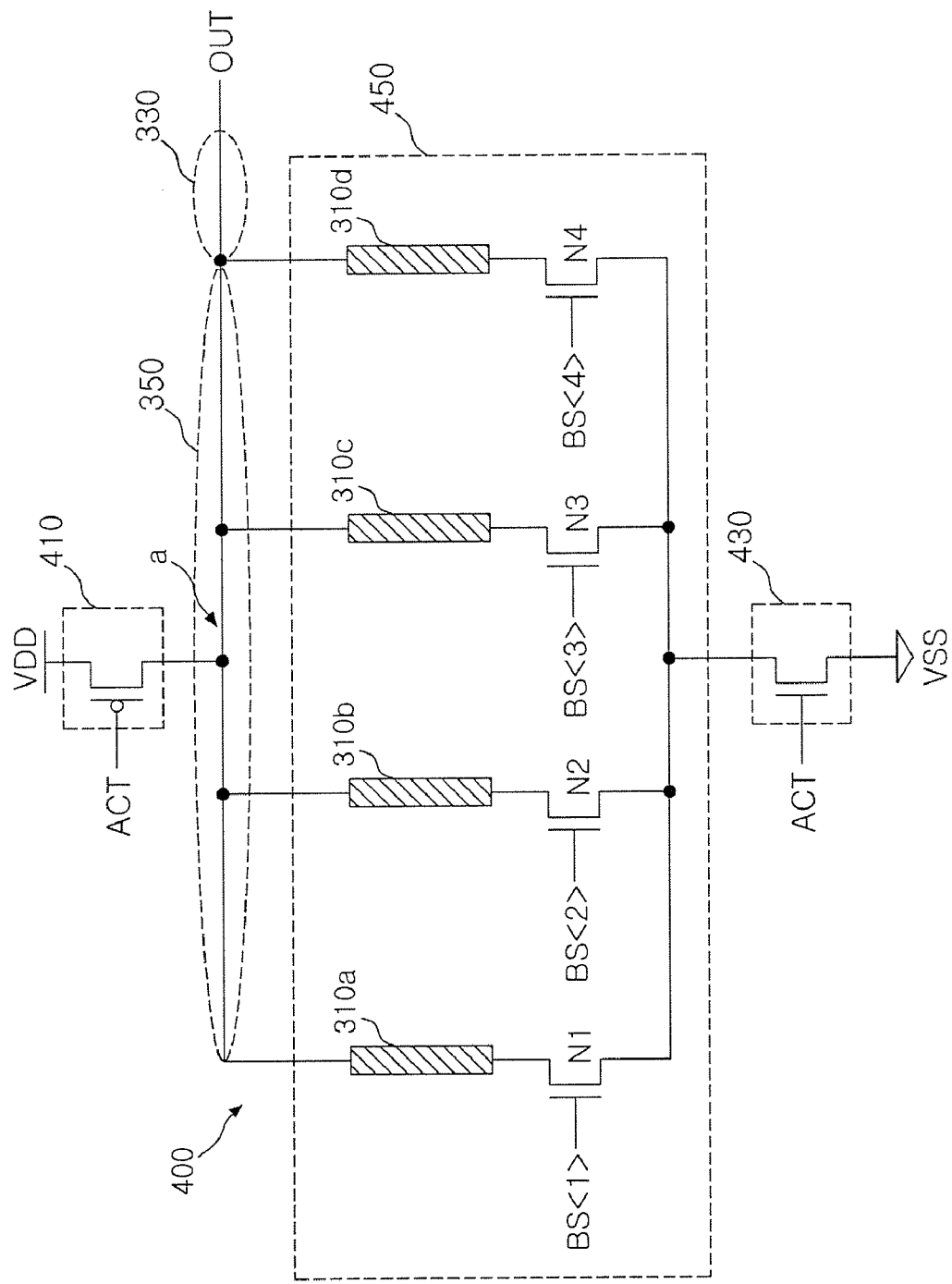
FIG. 6 is a circuit diagram illustrating a column address fuse circuit according to one embodiment.

FIG. 6 is a circuit diagram illustrating a column address fuse circuit according to one embodiment.

The column redundancy circuit block (not shown) included in the column fuse block 200 can include, for example, a plurality of column address fuse circuits 400 as much as the number of the fuse sets 300 included in the fuse box 210.

As shown in FIG. 6, the column address fuse circuit 400 can include a first driving unit 410, a second driving unit 430, and a blowing confirmation unit 450.

The first driving unit 410 is coupled between a power supply voltage terminal VDD and the blowing confirmation unit 450 to selectively switch on/off the power supply voltage in response to an active signal. For example, the first driving unit 410 can include a PMOS transistor.

The second driving unit 430 is coupled between the blowing confirmation unit 450 and a ground voltage terminal VSS to transfer the voltage, which is applied to the blowing confirmation unit 450, to the ground voltage terminal VSS in response to the active signal. For example, the second driving unit 430 can include an NMOS transistor. Here, the first and second driving units 410 and 430 are driven by the same active signal and these driving units inversely operate in an opposite manner.

The blowing confirmation unit 450 can include the address fuses 310a, 310b, 310c and 310d and switching elements N1, N2, N3 and N4. The blowing confirmation unit 450 is configured to output a high signal when the first driving unit 410 is driven and any one of the address fuses 310a, 310b, 310c and 310d is then blown. In more detail, one ends of the address fuses 310a, 310b, 310c and 310d are coupled to the first driving unit 410 and the other ends thereof are coupled to the switching elements N1, N2, N3 and N4, respectively. The switching elements N1, N2, N3 and N4 can include NMOS transistors which are selectively turned on/off in response to block selection signals BS<1:4>.

At this time, the common wire 350 (in FIG. 5), to which one end of each of the address fuses 310a, 310b, 310c and 310d is coupled, is a connection node "a" at which the address fuses 310a, 310b, 310c and 310d are coupled to the first driving unit 410 (in FIG. 6). The interconnection fuse 330 is an output terminal of the blowing confirmation unit 450. Furthermore, even though not shown in detail in FIG. 5, the address fuses 310a, 310b, 310c and 310d are coupled to the switching elements N1, N2, N3 and N4 in the column address fuse circuit 400, respectively.

Therefore, as shown in FIG. 7, even if the other ends of the address fuses 310a, 310b, 310c and 310d and the interconnection fuse 330 are extended toward the guard ring 250, a voltage is applied to the other ends of the address fuses 310a, 310b, 310c and 310d through the switching elements N1, N2, N3 and N4 (input is shown as "↑"), but the interconnection fuse 330 transfers information of the address fuses 310a, 310b, 310c and 310d to an output terminal (output is shown as "↓").

As mentioned above, the wire 350 which transfers the information of the address fuses 310a, 310b, 310c and 310d to the column redundancy circuit block (or column control block), is formed in a fuse type which is disposed within the fuse set 300, but not being routed to the circumference of the fuse set 300. At the same time, the fuse sets which are disposed within the fuse box 210 are arranged in two rows.

Accordingly, since the fuse sets, which have been previously separately disposed in two fuse boxes, can now be integrated into one single fuse box, then the defect information about the mats in the correspondent mat column can be stored in a single fuse box. Therefore, the height of the fuse block can be reduced which results in realizing a reduction in the area of the fuse block.

Furthermore, since it is not necessary to draw and route the wires, which transfer the address information, on the fringes of the fuse box, the routing area of the wires can be reduced, as well as, the space between the wires. As a result, the major axis of the fuse box 210 can be reduced substantially. The fuse box 210 can be disposed to correspond to the one mat column and the area of the fuse block can be further reduced.

Furthermore, as mentioned above, in the case where the fuse sets are arranged in two rows in one fuse box, the address fuses within the fuse set, each of which is disposed in a different row, can be cut selectively by using a dual beam, thereby reducing fuse blowing time.

The present invention is not limited to one embodiment described above.

Even though eight fuse sets in one fuse box are disposed in above-mentioned embodiment, the number of the fuse sets can be adjustable based on the integration of the semiconductor device.

Furthermore, even though the stack bank in which the two banks are coupled to each other without a disconnection is illustrated, various other bank structures including conventional bank structures and half-banks are also available.

In one embodiment, the column fuse blocks are disposed bank-by-bank between banks arranged in a column direction but these column fuse blocks can alternatively be disposed in various other types at any region.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A fuse box comprising:
   a plurality of fuse sets; and
   a guard ring arranged to surround the plurality of fuse sets,
   wherein the plurality of fuse sets are arranged in an area surrounded by the guard ring, in two rows.

2. The fuse box of claim 1, wherein the fuse sets are divided into upper and lower rows and wherein the upper and lower rows of the fuse sets are disposed symmetrically around a center line between the upper and lower rows.

3. The fuse box of claim 1, wherein the address fuses and the interconnection fuse are a same type.

4. The fuse box of claim 1, wherein one end of the address fuses are electrically coupled to one end of the interconnection fuse by a common wire.

5. The fuse box of claim 3, wherein the common wire is disposed in a vicinity near the center line.

6. The fuse box of claim 1, wherein the interconnection fuse is disposed between the address fuses.

7. The fuse box of claim 1, wherein the interconnection fuse is disposed at one side of the address fuses.

8. A semiconductor integrated circuit comprising:
   a bank having a plurality of mats are arranged in row and column directions along a constant interval; and
   a column fuse block disposed at an edge of the bank, the column fuse block having a plurality of fuse boxes,
   wherein each fuse box has a plurality of fuse sets which are arranged in two rows and each fuse box is disposed to correspond to the mats.

9. The semiconductor integrated circuit of claim 8, wherein each fuse set includes address fuses disposed with a constant interval, and includes an interconnection fuse disposed away from the address fuses.

10. The semiconductor integrated circuit of claim 9, wherein the address fuses and the interconnection fuse are of a same type.

11. The semiconductor integrated circuit of claim 10, wherein one end of each address fuse is electrically coupled to one end of the interconnection fuse by a common wire and the other end of each address fuse and the interconnection fuses extend towards a boundary of the fuse box.

12. The semiconductor integrated circuit of claim 10, further comprising a column control block at one side of the bank, wherein the interconnection fuse is electrically coupled to the column control block.

13. The semiconductor integrated circuit of claim 12, wherein the column control block and the column fuse block are adjacent to one side of the bank which is perpendicular to the column direction.

14. The semiconductor integrated circuit of claim 9, wherein the interconnection fuse is disposed between the address fuses.

15. The semiconductor integrated circuit of claim 9, wherein the interconnection fuse is disposed at one side of the address fuses.

16. The semiconductor integrated circuit of claim 8, wherein the fuse box is defined within a guard ring that prevents moisture from percolating into the fuse box.

17. A semiconductor integrated circuit comprising:
 a plurality of banks including a plurality of mat rows and mat columns each of which has a plurality of mats, wherein the banks are arranged in row and column directions and disposed away from each other;
 column control blocks disposed in a space between the banks and extend along a column direction; and
 column fuse blocks adjacent to the column control blocks, each of which includes a column redundancy circuit and a plurality of fuse boxes,
 wherein the fuse boxes include a plurality of fuse sets which are arranged in two rows, wherein the fuse boxes are disposed to correspond to the one mat column, and wherein each fuse box has an interconnection fuse and address fuses, which are arranged at a constant interval, and each fuse box is a same type.

18. The semiconductor integrated circuit of claim 17, wherein the fuse sets, which are disposed at different rows, are symmetrically disposed around a center line.

19. The semiconductor integrated circuit of claim 17, wherein one end of each address fuse is electrically coupled to one end of the interconnection fuse by a common wire and wherein the other end of each address fuse and of the interconnection fuses extend toward a boundary of the fuse box.

20. The semiconductor integrated circuit of claim 17, wherein the interconnection fuse is linearly extended and coupled electrically to the column redundancy circuit.

21. The semiconductor integrated circuit of claim 17, wherein the interconnection fuse is disposed between the address fuses.

22. The semiconductor integrated circuit of claim 17, wherein the interconnection fuse is disposed along one side of the address fuses.

23. The semiconductor integrated circuit of claim 17, wherein the number of the fuse sets integrated in the fuse box correspond to the number of the mat columns.

24. The semiconductor integrated circuit of claim 17, wherein the each fuse set is formed in each row of the fuse box, and are a same in number.

25. The semiconductor integrated circuit of claim 17, wherein the fuse box is a guard ring that prevents moisture from percolating to the fuse box and the interconnection fuse.

* * * * *